United States Patent [19]
Kim

[11] Patent Number: 6,118,158
[45] Date of Patent: Sep. 12, 2000

[54] STATIC RANDOM ACCESS MEMORY DEVICE HAVING A MEMORY CELL ARRAY REGION IN WHICH A UNIT CELL IS ARRANGED IN A MATRIX

[75] Inventor: Han-soo Kim, Suwon, Rep. of Korea

[73] Assignee: Samsung Electronics Co., Ltd., Suwon, Rep. of Korea

[21] Appl. No.: 08/883,348

[22] Filed: Jun. 26, 1997

[30] Foreign Application Priority Data

| Jun. 29, 1996 | [KR] | Rep. of Korea | 96-25934 |
| Jul. 23, 1996 | [KR] | Rep. of Korea | 96-29875 |
| Jun. 20, 1997 | [KR] | Rep. of Korea | 97-25400 |

[51] Int. Cl.[7] ............. H01L 29/76; H01L 29/94; H01L 31/062; H01L 31/113
[52] U.S. Cl. .......... 257/369; 257/903; 438/154; 438/199
[58] Field of Search ............... 257/369, 903; 438/154, 199

[56] References Cited

U.S. PATENT DOCUMENTS

| 5,072,286 | 12/1991 | Minami et al. | 257/369 |
| 5,854,497 | 12/1998 | Hiramoto et al. | 257/206 |
| 5,910,674 | 6/1999 | Kasai | 257/369 |

*Primary Examiner*—Donald L. Monin, Jr.
*Assistant Examiner*—Howard Weiss
*Attorney, Agent, or Firm*—Jones Volentine, LLC

[57] ABSTRACT

A static random access memory (SRAM) device having an improved degree of integration. The SRAM device has a cell array region in which a unit cell is arranged in a matrix. The unit cell includes a first NMOS inverter including a first NMOS driver transistor and a first NMOS access transistor, a second NMOS inverter including a second NMOS driver transistor and a second NMOS access transistor, a first CMOS inverter including the first NMOS driver transistor and a first PMOS load transistor, and a second CMOS inverter including the second NMOS driver transistor and a second PMOS load transistor, wherein the first and second NMOS inverters, and the first and second CMOS inverters are respectively connected by a flip-flop, and a pick-up region for applying a predetermined bias voltage to the memory cell array region formed in a semiconductor substrate is included in the memory cell array region.

3 Claims, 19 Drawing Sheets

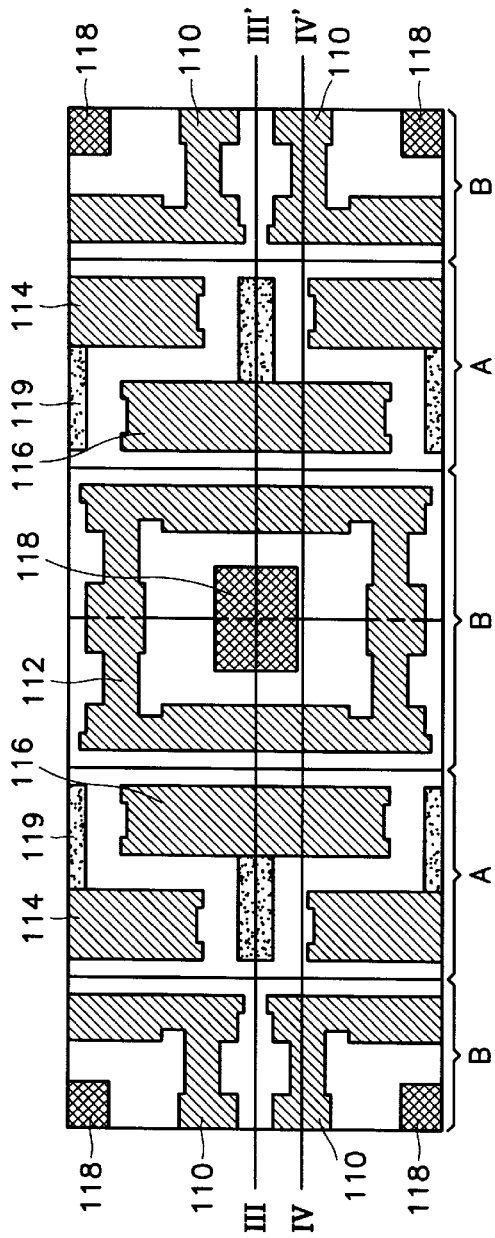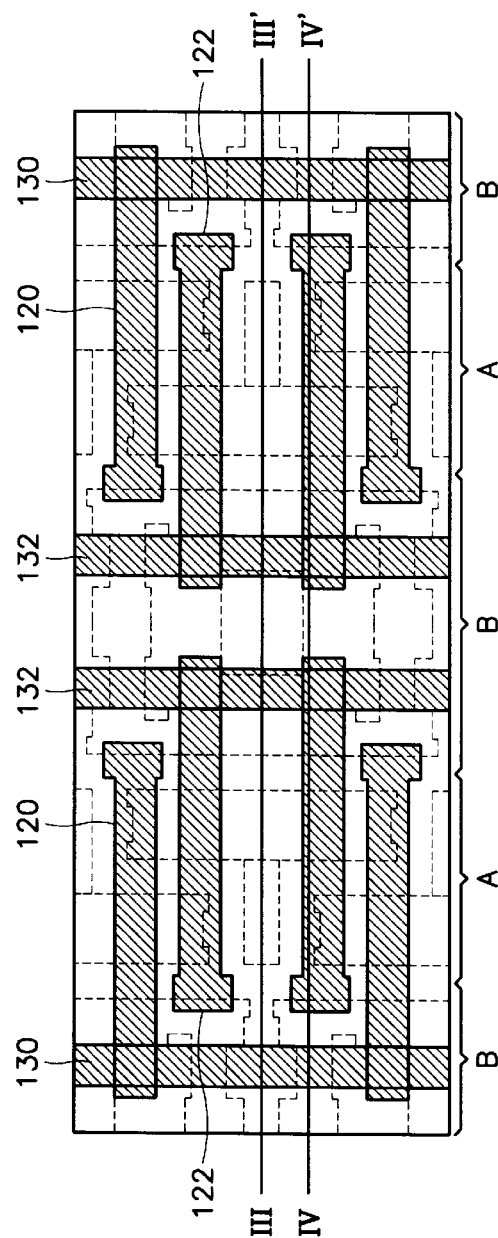
FIG. 2A
FIG. 2B

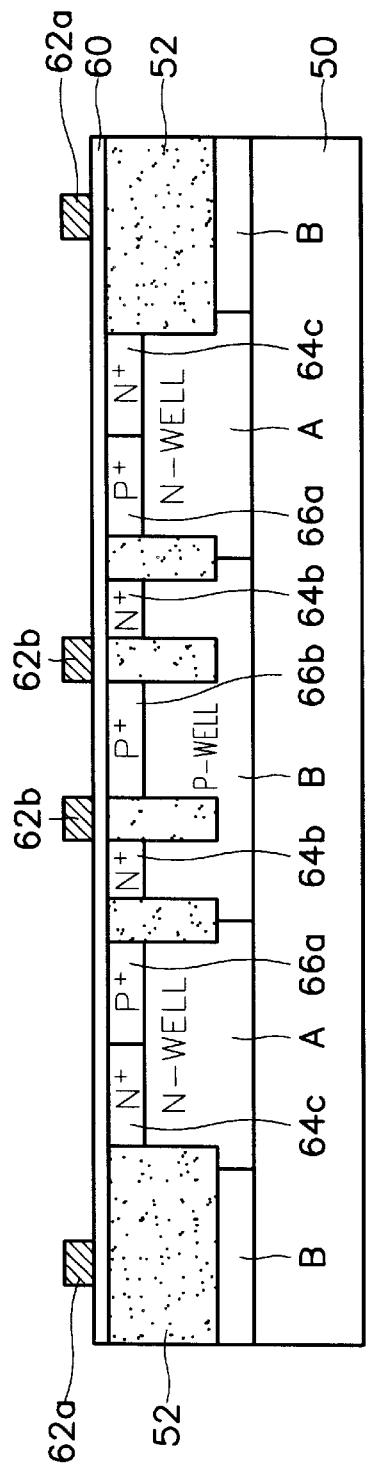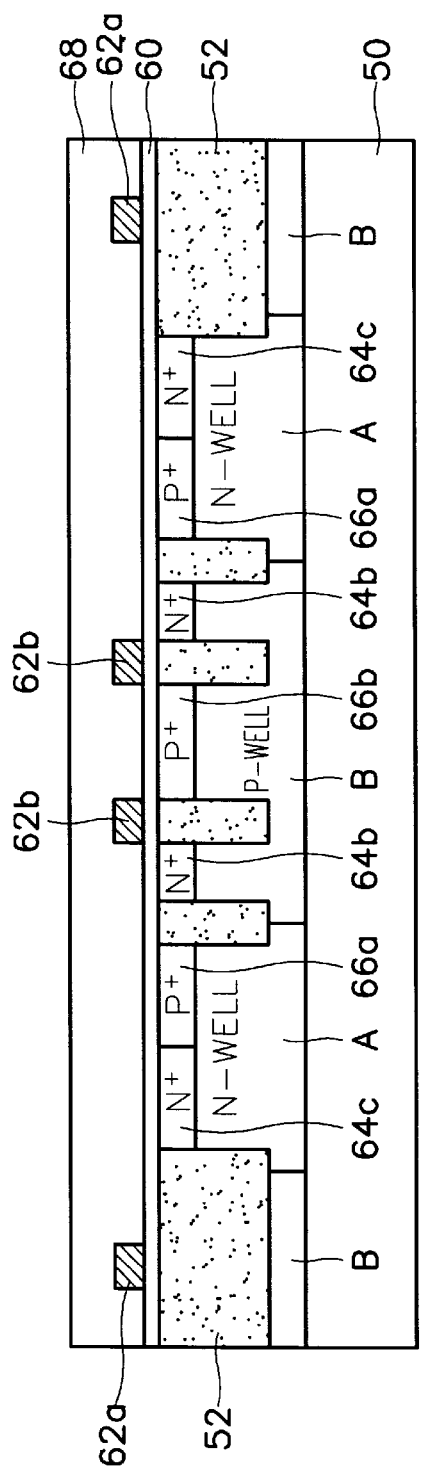

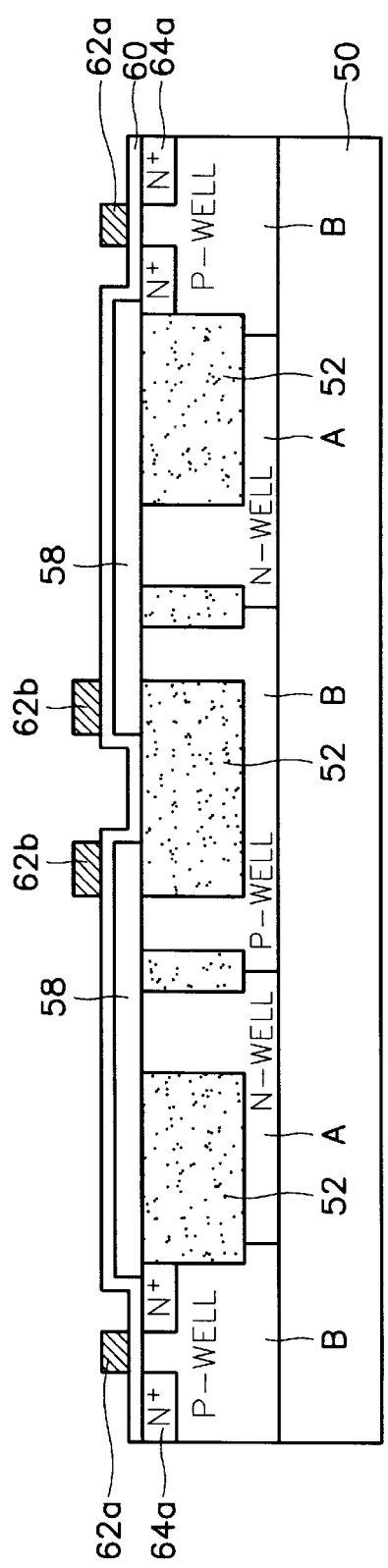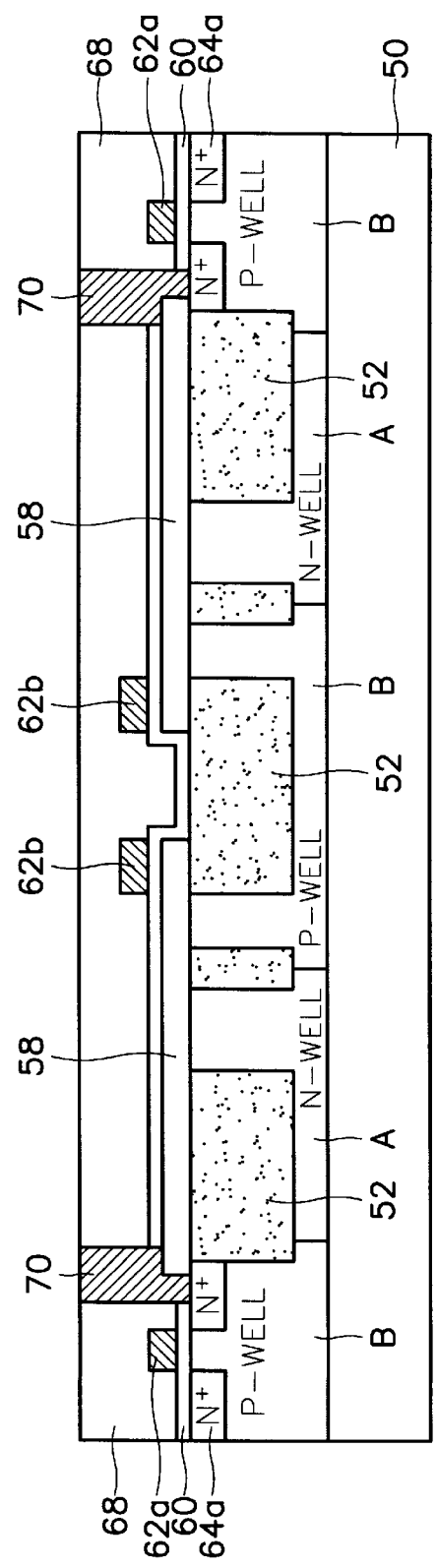

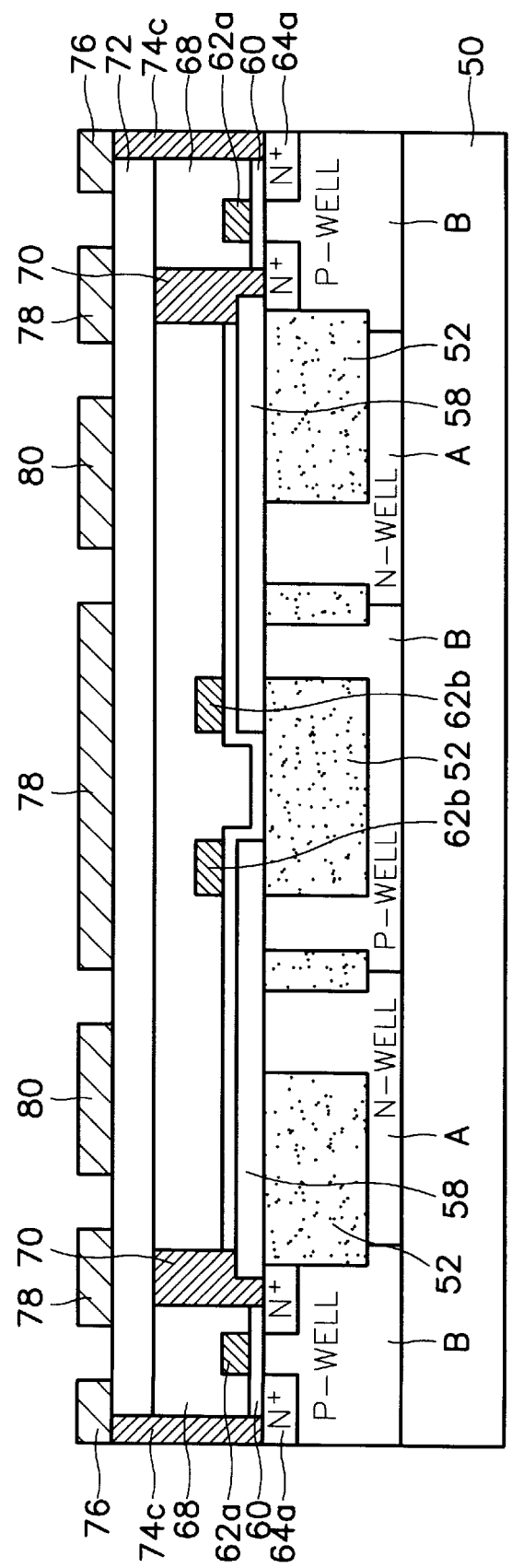

STATIC RANDOM ACCESS MEMORY DEVICE HAVING A MEMORY CELL ARRAY REGION IN WHICH A UNIT CELL IS ARRANGED IN A MATRIX

BACKGROUND OF THE INVENTION

1. Field of the Invention

The present invention relates to a semiconductor memory device, and more particularly, to a static random access memory device of which the degree of integration is improved.

2. Description of the Related Art

In general, a static random access memory (SRAM) has a low integration density as compared to a dynamic random access memory (DRAM). However, the SRAM has been used widely in a mid- to small-sized computer due to its high operating speed. An SRAM cell is constituted of a flip-flop circuit including two access transistors, two driver transistors and two load elements. Stored information is maintained as a voltage due to a charge accumulated at a node of the cell. The charge is always supplemented through a load element, so that the SRAM does not require a refresh function in contrast to the DRAM.

The SRAM cell may use a depletion type NMOS transistor as a load element, however, the depletion type NMOS transistor is not used today due to its high power consumption. Instead of the NMOS transistor, a polysilicon resistor having high resistance is widely used such that the power consumption is reduced, simplifying the manufacturing process. However, as the integration density of a memory increases, a full CMOS type SRAM cell adopting a bulk type PMOS transistor as a load element is widely used in order to improve the operation characteristic at low voltage. The full CMOS type SRAM cell has low power consumption in a stand-by mode, and excellent immunity against an α-particle.

FIG. 1 is a general circuit diagram of an SRAM cell adopting a PMOS transistor as a load element.

Referring to FIG. 1, one SRAM cell includes a pair of inverters which are cross-coupled each other between a power terminal Vcc and ground terminal Vss, and first and second access transistors T1 and T2 of which the sources (or drains) are connected to output nodes of the inverters.

Here, the drain (or source) of the first access transistor T1 and the drain (or source) of the second access transistor T2 are respectively connected to a first bit line BL and a second bit line $\overline{BL}$ having information opposite to that of the first bit line BL.

Also, a first inverter of the pair of inverters includes a first load transistor T5 constituted of a PMOS transistor and a first driver transistor T3 constituted of an NMOS transistor, and a second inverter of the pair of inverters includes a second load transistor T6 constituted of a PMOS transistor and a second driver transistor T4 constituted of an NMOS transistor.

Also, the first and second access transistors T1 and T2 are both constituted of NMOS transistors, and gate electrodes of the first and second access transistors are connected to word lines WL1 and WL2, respectively.

However, a full CMOS type SRAM cell consists of six transistors, that is, a pair of driver transistors, a pair of access transistors and a pair of load transistor. Thus, it is difficult to realize a high density SRAM with the full CMOS type SRAM cell in spite of its excellent operational characteristics.

When using a bulk type PMOS transistor as a load element of the memory cell, a P-well for forming NMOS driver transistors and NMOS access transistors, and an N-well for forming PMOS load transistors should be formed in the memory cell. Thus, ground voltage and power voltage should be applied to the P-well and the N-well, respectively.

According to the conventional art, after a cell array having a predetermined density is constructed, well pick-up regions for applying bias voltages to the P-well and the N-well should be formed in the other region excluding the cell array. Thus, the chip size is increased by the extra regions (well pick-up regions).

SUMMARY OF THE INVENTION

To solve the above problem, it is an object of the present invention to provide a static random access memory (SRAM) device.

To achieve the above object, there is provided a static random access memory (SRAM) device having a cell array region in which a unit cell is arranged in a matrix. The unit cell comprises: a first NMOS inverter including a first NMOS driver transistor and a first NMOS access transistor; a second NMOS inverter including a second NMOS driver transistor and a second NMOS access transistor; a first CMOS inverter including the first NMOS driver transistor and a first PMOS load transistor; and a second CMOS inverter including the second NMOS driver transistor and a second PMOS load transistor, wherein the first and second NMOS inverters, and the first and second CMOS inverters are respectively connected by a flip-flop, and a pick-up region for applying a predetermined bias voltage to the memory cell array region formed in a semiconductor substrate is included in the memory cell array region.

Preferably, a P-well for forming the NMOS transistor is formed in the memory cell array region, and a P-well pick-up region for applying a ground voltage Vss to the P-well is formed in the P-well. Preferably, an N-well for forming the PMOS transistor is formed in the memory cell array region, and an N-well pick-up region for applying a power voltage Vcc to the N-well is formed within the N-well. Preferably, the P-well and the N-well are formed in the memory cell array region being adjacent to each other, and the P-well pick-up region and the N-well pick-up region are formed in the P-well and the N-well, respectively.

It is preferable that the SRAM device comprises a first conductive layer for connecting the sources of the first and second driver transistors and the P-well pick-up region. Preferably, the N-well pick-up region is formed to be adjacent to the source of the PMOS load transistor.

It is preferable that the SRAM device comprises a contact hole for simultaneously exposing the N-well pick-up region and the source of the PMOS load transistor.

Preferably, the SRAM device comprises a second conductive layer simultaneously contacting the N-well pick-up region and the source of the PMOS load transistor via the contact hole.

Preferably, an output node of the first CMOS inverter and an input node of the second CMOS inverter are connected by one contact hole. Preferably, an output node of the second CMOS inverter and an input node of the first CMOS inverter are connected by one contact hole. Preferably, an output node of the first CMOS inverter and an input node of the second inverter are connected by one contact hole, and an output node of the second CMOS inverter and an input node of the first CMOS inverter are connected by one contact hole.

It is preferably that the drains of the driver transistor and the PMOS load transistor forming an output node of the first CMOS inverter are connected by one contact hole, and the drains of the driver transistor and the PMOS load transistor forming an output node of the second CMOS inverter are connected by one contact hole. Preferably, a gate of a CMOS inverter is simultaneously connected to an other CMOS transistor by a flip-flop via the contact hole connecting the drains of the driver transistor and PMOS load transistor, the driver transistor and the PMOS load transistor forming the other CMOS transistor.

Also, there is provided a static random access memory (SRAM) device having a cell array region in which a plurality of unit cells are arranged in a matrix such that cells adjacent in the Y-axial direction are symmetrical with respect to the X-axis, and cell adjacent in the X-axial direction are symmetrical with respect to the Y-axis. Here, the unit cell comprises: two P-wells formed being spaced apart and an N-well sandwiched between the two P-wells in a rectangular region being adjacent to each other; a pair of P-well pick-up regions each arranged at a pair of facing corners among four corners of the rectangular region, being located in the P-well; first and second active regions arranged symmetrically with respect to the center of the rectangular region with a predetermined distance from each P-well pick-up region, being located in the P-well; third and fourth active regions arranged in each N-well formed between the first and second active regions, having a bar pattern parallel to the Y-axial direction, wherein one end of each bar pattern is elongated to the border of the N-well such that the third and fourth active regions are symmetrical with respect to the center of the rectangular region; first and second N-well pick-up regions arranged contacting the one end of the third active region elongated to the border of the N-well, and the one end of the fourth active region elongated to the border of the N-well, respectively; a first gate electrode arranged adjacent to the second active region, crossing the first active region and the third active region adjacent to the first active region; a second gate electrode arranged adjacent to the first active region, crossing the second active region and the fourth active region adjacent to the second active region; first and second word lines arranged parallel to the Y-axis, crossing the first and second active regions; a first contact for electrically connecting the first and second gate electrode to the second and first active regions, respectively; a second contact for electrically connecting the first and second gate electrodes to the third and fourth active regions, respectively first and second power contacts each for exposing the first N-well pick-up region and the third active region adjacent to the first N-well pick-up region, and the second N-well pick-up region and the fourth active region adjacent to the second N-well pick-up region, respectively; a power line arranged in the Y-axial direction, covering the first and second power contacts; a first ground contact for exposing the first active region located at the border of the first N-well pick-up region and the P-well pick-up region adjacent to the first active region, being contacting the first gate electrode; a second ground contact for exposing the second active region located at the border of the second N-well pick-up region and the P-well pick-up region adjacent to the second active region, contacting the second gate electrode; a first ground line arranged in the Y-axial direction, covering the first ground contact; a second ground line arranged in the Y-axial direction covering the second ground contact; a first bit line contact for exposing the first active region located at the border of the first P-well region, contacting the first word line; a second bit line contact arranged in the X-axial direction, covering the first bit line contact; a second bit line contact for exposing the second active region located at the border of the second P-well region, contacting the second word line; and a second bit line arranged in the X-axial direction, covering the second bit line contact.

Preferably, the first power contact simultaneously exposes the first N-well pick-up region and the third active region. Preferably, the second power contact simultaneously exposes the second N-well pick-up region and the fourth active region.

Also, there is provided a static random access memory (SRAM) device. The SRAM device comprises: an isolation film formed in a non-active region of a semiconductor device; N-wells and P-wells alternately formed in the semiconductor device; N-well pick-up regions and P-well pick-up regions formed in the N-well and the P-well, respectively; first through fourth gate electrodes formed on the semiconductor substrate; fifth and sixth gate electrodes insulated from the first through fourth gate electrodes by a first interlayer dielectric (ILD) film; first and second sources/drains formed in the N-well; third through sixth sources/drains formed in the P-well; power lines connected to the first and second sources/drains; ground lines connected to the third and fourth sources/drains; and first and second bit lines connected to the fifth and sixth sources/drain, respectively.

Preferably, the isolation film is formed of an oxide film buried in a trench formed in the semiconductor device. Preferably, the N-well pick-up region is formed to be adjacent to the first and second sources/drains. Preferably, the first and third gate electrodes are formed in one conductive layer, and the second and fourth gate electrodes are formed in one conductive layer. Preferably, the first and third gate electrodes are for the first and second PMOS load transistors, the second and fourth gate electrodes are for the first and second driver transistors, and the fifth and sixth gate electrodes are the first and second access transistors. Preferably, the fifth and sixth gate electrodes are orthogonal with respect to the first through fourth gate electrodes.

Also, preferably, the SRAM device further comprises, below the power line and the ground line, a second ILD film covering the resultant structure having the fifth and sixth gate electrodes; two first plugs covering contact holes which simultaneously expose the first gate electrode and the fifth source/drain, and the second gate electrode and the sixth source/drain; a third ILD film covering the resultant structure having the first plugs; two second plugs covering contact holes which simultaneously expose the first and second sources/drains and the N-well pick-up region, passing through the third ILD film; two third plugs covering contact holes each of which exposes the third and fourth source/drain, passing through the third ILD film; a fourth plug covering a contact hole which exposes the P-well pick-up region, passing through the third ILD film; and two fifth plugs covering contact holes each of which exposes the fifth and sixth sources/drains, passing through the third ILD film.

Preferably, the first and second bit lines are respectively connected to the fifth and sixth sources/drains via a first pad and a second pad each of which is connected to two fifth plugs. Preferably, the ground line is simultaneously connected to the third and fourth plugs.

According to the present invention, impurity regions for biasing the P-well and N-well are formed within the memory cell to obviate the need for an extra region for forming the impurity regions, so that the chip size can be markedly reduced. Also, the well bias is applied to each memory cell, so that a voltage drop caused by resistance can be reduced, thereby improving cell characteristics compared to that of a conventional SRAM cell.

BRIEF DESCRIPTION OF THE DRAWINGS

The above object and advantages of the present invention will become more apparent by describing in detail preferred embodiments thereof with reference to the attached drawings in which:

FIGS. 2A through 2H are layout diagrams illustrating an SRAM according to a preferred embodiment of the present invention by layers;

FIGS. 3A through 3H are sectional views cut along the line III–III' of FIGS. 2A through 2H, illustrating a method for manufacturing the SRAM cell according to a preferred embodiment of the present invention based on the layout diagrams of FIGS. 2A through 2H;

FIGS. 4A through 4H are sectional views cut along the line IV–IV' of FIGS. 2A through 2H, illustrating the method for manufacturing the SRAM cell according to the present invention based on the layout diagrams of FIGS. 2A through 2H;

DESCRIPTION OF THE PREFERRED EMBODIMENT

Figure 1:
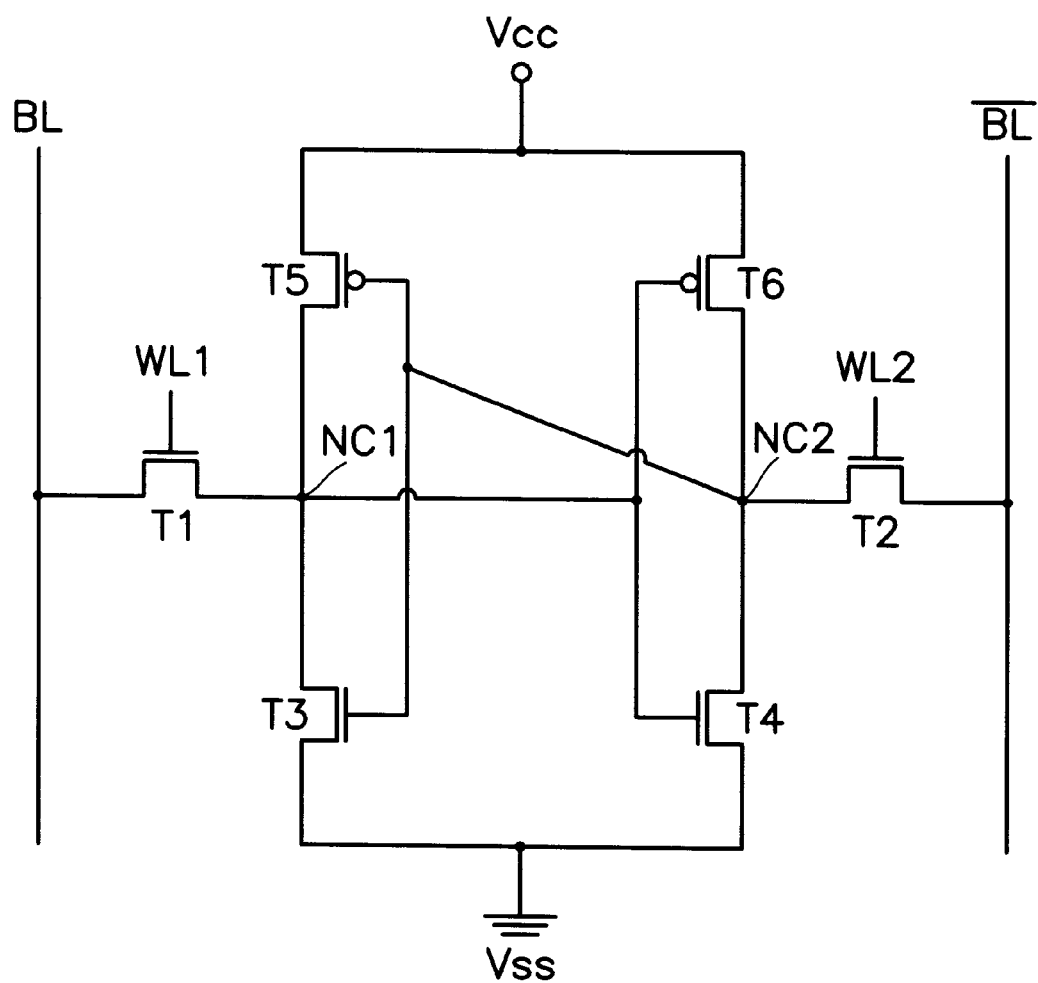
FIG. 1 is a general circuit diagram of a static random access memory (SRAM) adopting a PMOS transistor as a load element.

Referring to FIGS. 2A through 2H, a static random access memory (SRAM) according to a preferred embodiment of the present invention will be described in detail. Here, four memory cells constituting one block are shown. Reference character "A" represents an N-well in which a PMOS transistor is to be formed, and reference character "B" represents a P-well in which an NMOS transistor is to be formed. A unit memory cell has two P-well regions B which are spaced apart and one N-well region A which is sandwiched between two P-well regions B.

FIG. 2A is a layout diagram showing mask patterns for forming active regions.

Mask patterns 110 and 112 for forming a first active region are arranged in a region in which four unit memory cells are adjacent to each other, and at the border of the block including the four memory cells. Reference numeral 110 represents the mask pattern for forming the active regions of the first driver transistor T3 of FIG. 1 and the first access transistor T1 of FIG. 1. Reference numeral 112 represents the mask pattern for forming the active regions of the second driver transistor T4 of FIG. 4 and the second access transistor T2 of FIG. 1.

Mask patterns 114 and 116 for forming a second active region are arranged in a region in which two unit memory cells are adjacent. Here, T-shaped or the upside-down T-shaped mask patterns are alternately repeated. Reference numeral 114 represents the mask pattern for forming the active regions of the first PMOS load transistor T5 of FIG. 1, and reference numeral 116 represents the mask pattern for forming the active regions of the second PMOS load transistor T6 of FIG. 1.

A mask pattern 118 for forming a third active region is formed in the P-well B, and surrounded by the mask patterns 110 and 112 for forming the active region. The mask pattern 118 is a P-well pick-up region for applying a bias voltage to the P-well B. The P-well pick-up region 118 is arranged being shared by the four adjacent memory cells.

A mask pattern 119 for forming a fourth active region is arranged in the N-well A, contacting the mask patterns 114 and 116 for forming the second active region. The mask pattern 119 is an N-well pick-up region for applying a bias voltage to the N-well A.

FIG. 2B is a layout diagram showing mask patterns for forming gates of the first and second driver transistors, first and second access transistors, and first and second PMOS load transistors.

Mask pattern 120 is disposed across the active regions 110 and 114, and mask pattern 122 is disposed across the active regions 112 and 116. The reference numeral 120 represents the mask pattern for forming the gates of the first driver transistor T3 of FIG. 1 and the first PMOS load transistor T5 of FIG. 1. The reference numeral 122 represents the mask pattern for forming the gates of the second driver transistor T4 of FIG. 1 and the second PMOS load transistor T6 of FIG. 1.

Mask patterns 130 and 132 for forming gates of the first and second access transistors are disposed across the active regions 110 and 112, respectively. The reference numeral 130 represents the mask pattern for forming the gate of the first access transistor T1 of FIG. 1, which functions as a first word line. The reference numeral 132 represents the mask pattern for forming the gate of the second access transistor T2 of FIG. 1, which functions as a second word line.

The gates of the driver transistors and the load transistors are arranged such that they are formed in the same conductive layer. Meanwhile, the gates of the driver transistors and the access transistors are formed in different conductive layers, arranged orthogonal to each other.

Referring to FIGS. 2A and 2B, an overlapping portion between the mask pattern 110 and the mask pattern 120 becomes the gate of the first driver transistor T3 of FIG. 1. Also, the upper and lower portions of the gate of the first driver transistor T3 become the source and the drain, respectively.

The overlapping portion between the mask pattern 110 and the mask pattern 130 is to be the gate of the first access transistor T1 of FIG. 1. Also, the left and right portions of the gate of the first access transistor become the source (or drain) and the drain (or source), respectively.

An overlapping portion between the mask pattern 112 and the mask pattern 122 becomes the gate of the second driver transistor T4 of FIG. 1. Also, the upper and lower portions of the gate of the second driver transistor become the drain and the source, respectively.

An overlapping portion between the mask pattern 112 and the mask pattern 132 becomes the gate of the second access transistor T2 of FIG. 1. Also, the left and right portions of the gate of the second access transistor become the source (or drain) and the drain (or source), respectively.

An overlapping portion between the mask pattern 114 and the mask pattern 120 becomes the gate of the first PMOS load transistor T5 of FIG. 1. Also, the upper and lower portions of the gate of the first PMOS load transistor become the source and the drain, respectively.

An overlapping portion between the mask pattern 116 and the mask pattern 122 becomes the gate of the second PMOS load transistor T6 of FIG. 1. Also, the upper and lower portions of the gate of the second PMOS load transistor become the drain and the source, respectively.

The source (or drain) of the first access transistor and the drain of the first driver transistor are connected by being formed in the same active region 110, and the source (or drain) of the second access transistor and the drain of the second driver transistor are connected being formed in the same active region 112.

Figure 2C:
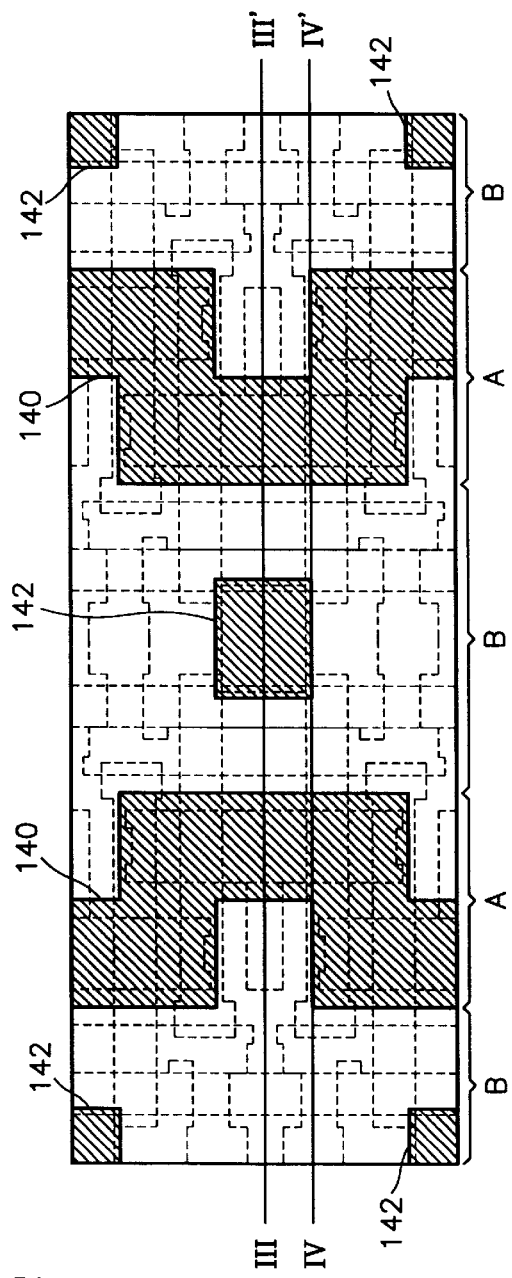

FIG. 2C is a layout diagram showing mask patterns for forming the sources and drains of the access transistors and the load transistors, and the N-well pick-up region and the P-well pick-up region.

Here, reference numeral 140 represents the mask pattern for forming the source and drain of the PMOS load transistor, and reference numeral 142 represents the mask pattern for forming the P-well pick-up region for applying a predetermined voltage, e.g, 0V, to the P-well B. The remaining region of the mask patterns 140 and 142 is a portion into which a high concentration of $N^+$-impurities are to be implanted in order to form sources/drains of the driver transistors, access transistors, and the N-well pick-up region.

Figure 2D:
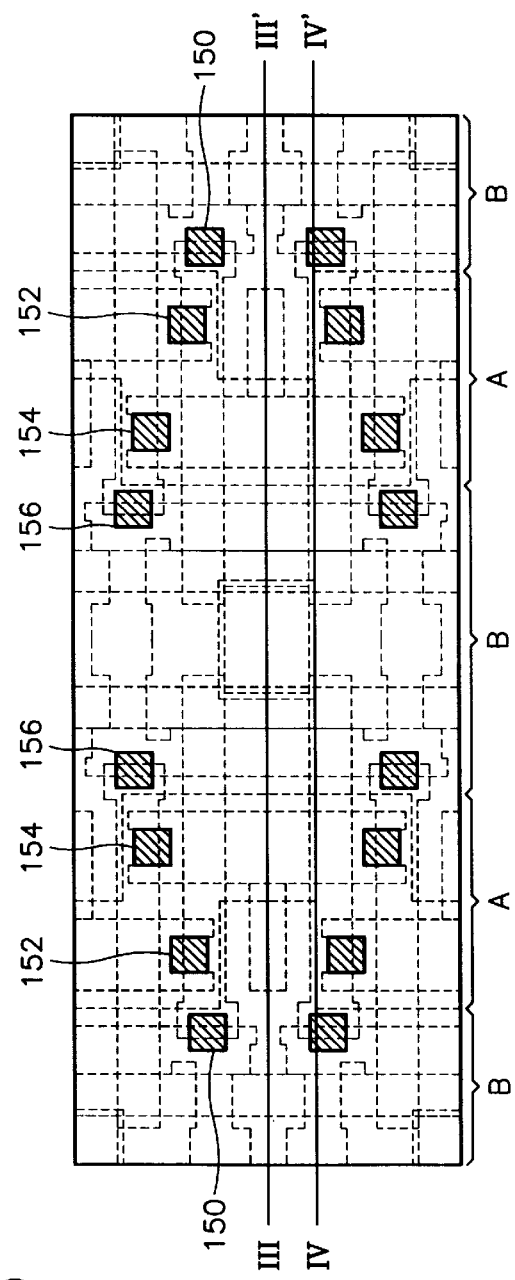

FIG. 2D is a layout diagram showing mask patterns for forming node contacts.

Here, reference numerals 150 and 152 represent the mask patterns for forming a first node contact NC1 of FIG. 1, and reference numerals 154 and 156 represent the mask patterns for forming a second node contact NC2 of FIG. 2.

In detail, reference numeral 150 represents the mask pattern for a contact hole for connecting the drain of the first driver transistor T3 to the gate of the second PMOS load transistor T6. Reference numeral 152 represents the mask pattern for forming a contact hole for connecting the drain of the first PMOS load transistor T5 to the gate of the second PMOS load transistor T6.

The gate of the second PMOS load transistor T6 and the gate of the second driver transistor T4 are connected by being formed in the same conductive layer 122. Accordingly, the source (or drain) of the first access transistor T1, the drain (or source) of the first driver transistor T3, the drain of the first PMOS load transistor T5, and the gates of the first driver transistor T4 and the second PMOS load transistor T6 are connected by the first node contact 150 and 152 (NC1 of FIG. 1).

Reference numeral 154 represents the mask pattern for forming a contact hole for connecting the drain of the second PMOS load transistor T6 to the gate of the first PMOS load transistor T5. Reference numeral 156 represents the mask pattern for forming a contact hole for connecting the drain (or source) of the second access transistor T2 and the gate of the first PMOS load transistor T5.

The drain of the second driver transistor T4 and the source (or drain) of the second access transistor T2 are connected by being formed in the same active region 112. The gates of the first driver transistor T3 and the first PMOS load transistor T5 are connected by being formed in the same conductive layer 120. Accordingly, the source (or drain) of the second access transistor T2, the drain of the second driver transistor T4, the drain of the second PMOS load transistor T6, and the gates of the first driver transistor T3 and the first PMOS load transistor T5 are connected by the second node contact 154 and 156 (NC2 of FIG. 1).

Figure 2E:
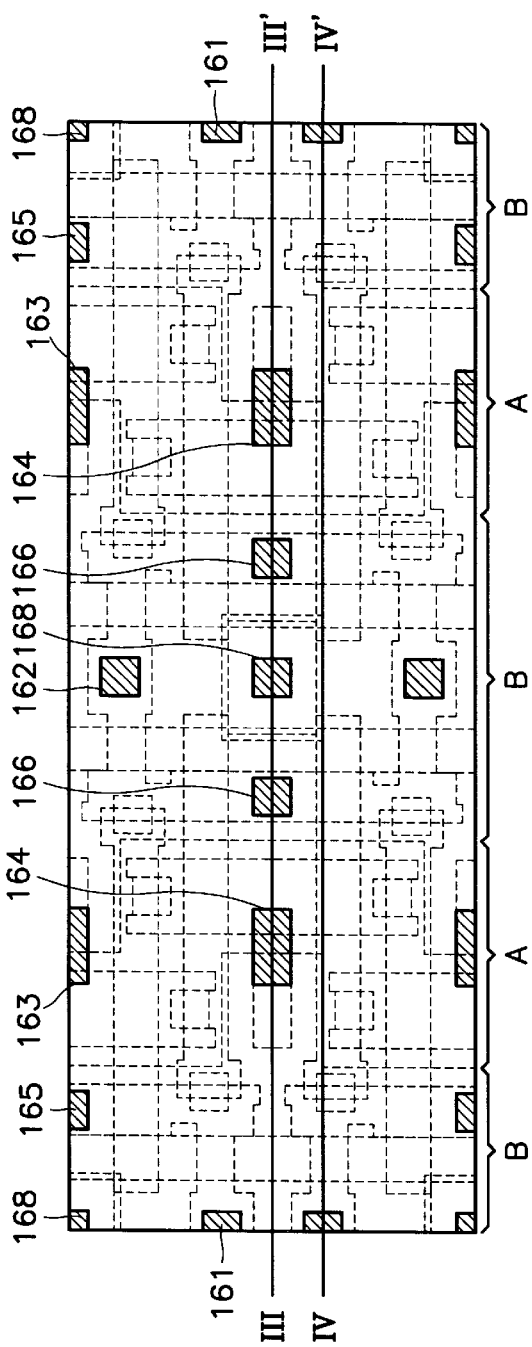

FIG. 2E is a layout diagram showing mask patterns for forming a metal contact.

Here, reference numeral 161 represents the mask pattern for forming a first bit contact hole for connecting the drain of the first access transistor to a first bit line BL. Reference numeral 162 represents the mask pattern for forming a second bit contact hole for connecting the drain of the second access transistor to a second bit line $\overline{BL}$.

Reference numeral 163 represents the mask pattern for forming a contact hole for connecting the source of the first PMOS load transistor and the N-well pick-up region to a Vcc line, and reference numeral 164 represents the mask pattern for forming a contact hole for connecting the source of the second PMOS load transistor and the N-well pick-up region to the Vcc line. The source of the second PMOS load transistor and the N-well pick-up region are connected to the Vcc line via one contact hole.

Reference numeral 165 represents the mask pattern for forming a contact hole for connecting the source of the first driver transistor to a Vss line, and reference numeral 166 represents the mask pattern for forming a contact hole for connecting the source of the second driver transistor to the Vss line.

Reference numeral 168 represents the mask pattern for forming a contact hole for connecting the P-well pick-up region to the Vss line.

Figure 2F:
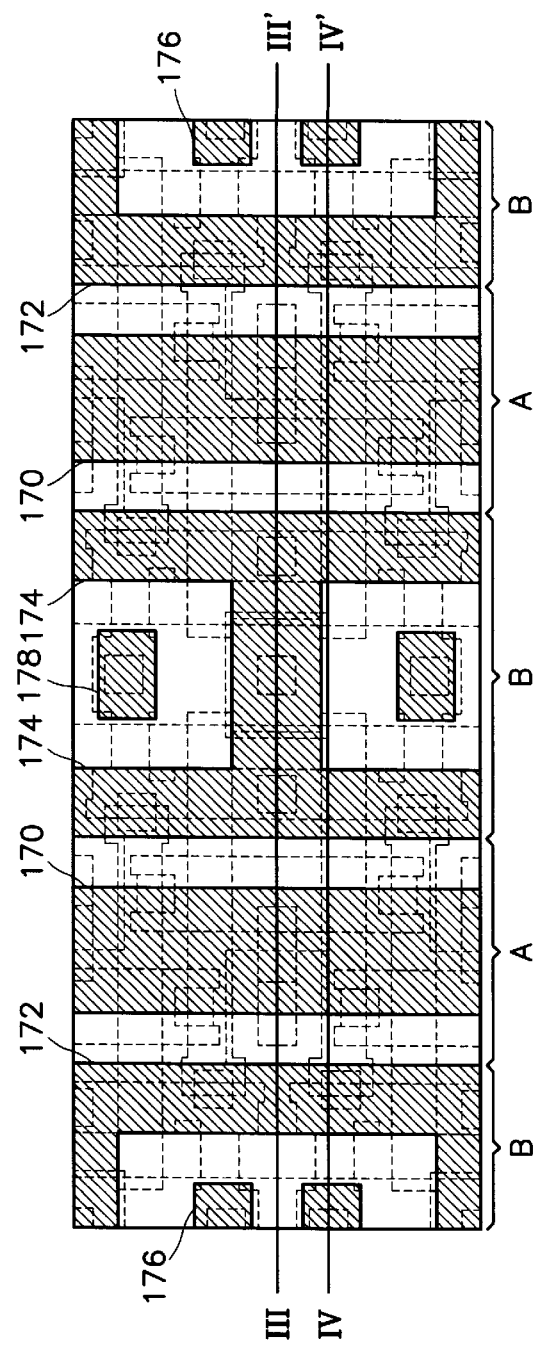

FIG. 2F is a layout diagram showing mask patterns for forming the Vcc line, the Vss line and the pads. A mask pattern 170 for forming the Vcc line is disposed to cover the contact holes 163 and 164. Mask patterns 172 and 174 for forming the Vss line are arranged parallel to the mask pattern 170 for forming the Vcc line 170. The mask pattern 170 for forming the Vcc line and the mask patterns 172 and 174 for forming the Vss line are alternately arranged on cell array region.

Reference numeral 176 represents a mask pattern for forming a first pad for connecting the drain (or source) of the first access transistor to the first bit line BL. Reference numeral 178 represents a mask pattern for forming a second pad for connecting the drain (or source) of the second access transistor to the second bit line $\overline{BL}$.

Figure 2G:
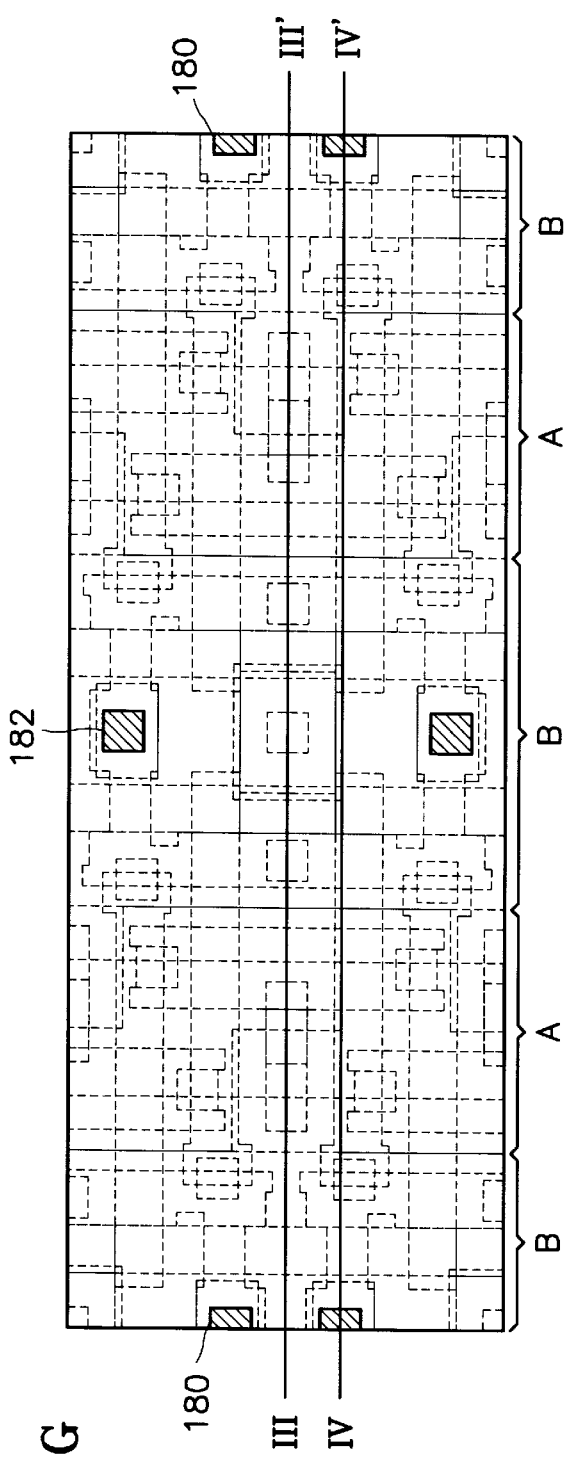

FIG. 2G is a layout diagram showing mask patterns for connecting the first and second pads to the first and second bit lines, respectively.

Reference numeral 180 represents a mask pattern for forming a contact hole for connecting the first pad and the first bit line BL. Reference numeral 182 represents a mask pattern for forming a contact hole for connecting the second pad to the second bit line $\overline{BL}$.

The first pad is connected to the drain (or source) of the first access transistor, so that the drain (or source) of the first access transistor is connected to the first bit line by the mask pattern 180. Also, since the second pad is connected to the drain (or source) of the second access transistor, the drain (or source) of the second access transistor is connected to the second bit line.

Figure 2H:
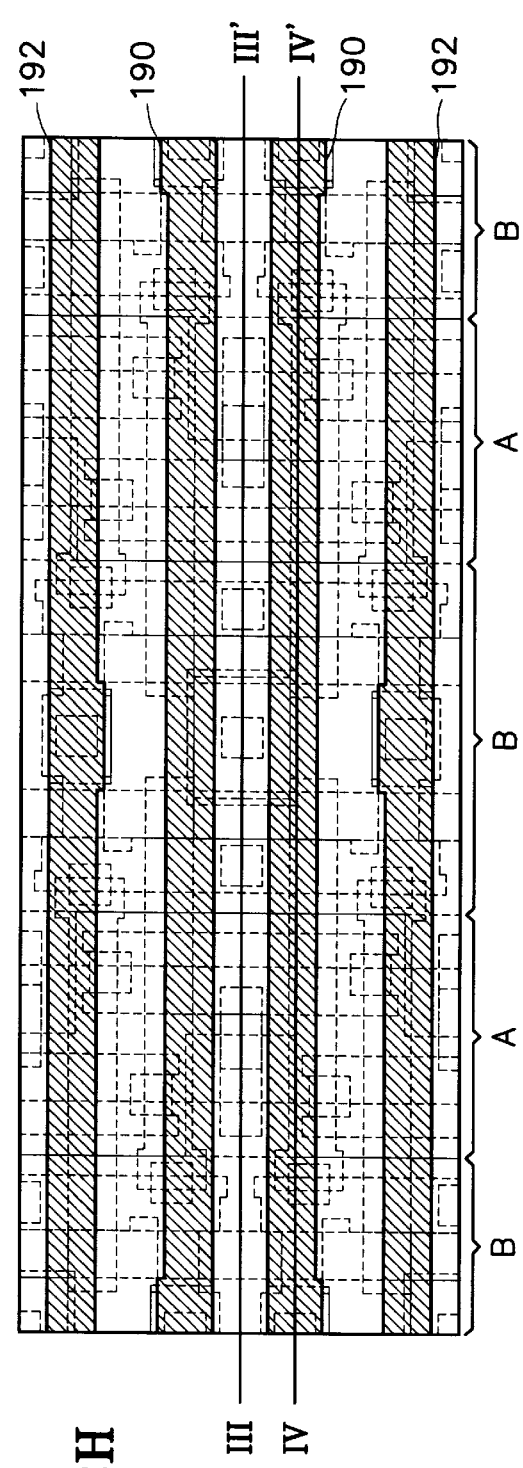

FIG. 2H is a layout diagram of mask patterns for forming the first and second bit lines.

Reference numeral 190 represents a mask pattern for forming the first bit line BL, and the reference numeral 192 represents a mask pattern for forming the second bit line $\overline{BL}$. The mask patterns 190 and 192 are arranged in parallel.

Referring to FIGS. 2A through 2H, N-type active regions 110 and 112 for forming an NMOS transistor and P-type active regions 114 and 116 for forming a PMOS transistor are appropriately arranged in a memory cell to have the optimum size. Also, the P-well pick-up region 118 is arranged at the center and corners of a unit block constituted by four adjacent memory cells. The N-well pick-up region 119 is arranged in a region at which two memory cells adjoin each other. Thus, it is unnecessary to make an extra region for forming the P-well and N-well pick-up regions outside the memory cell, so that the chip size can be markedly reduced.

Next, a method for manufacturing the SRAM cell according to the present invention will be described in detail with reference to FIGS. 2A through 2H. FIGS. 3A through 3H, and FIGS. 4A through 4H are sectional views illustrating the method for manufacturing the SRAM cell according to the present invention, wherein FIGS. 3A through 3H are sectional views cut along the line III–III' of respective FIGS. 2A through 2H, and FIGS. 4A through 4H are sectional views cut along line IV–IV' of respective FIGS. 2A through 2H.

Figure 3A:
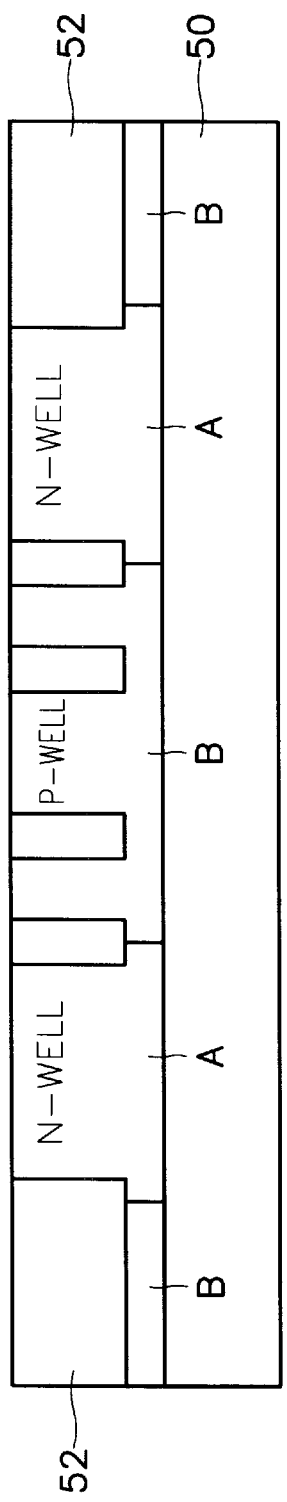
Figure 4A:
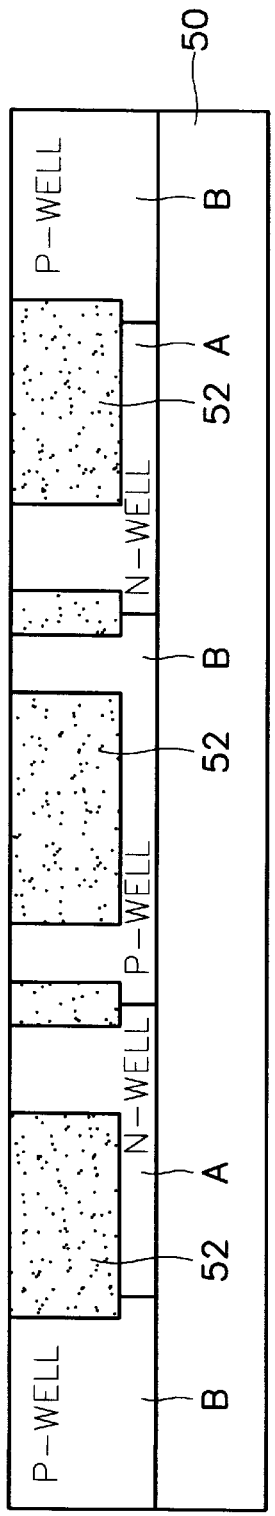

FIGS. 3A and 4A illustrate the step of forming an isolation film 52, an N-well A and a P-well B.

In detail, a photolithography process is performed using the mask patterns 110~119 to define the active regions in a semiconductor substrate 50. Then, the isolation film 52 is formed in a non-active region of the semiconductor substrate 50 by a general isolation process. Preferably, the isolation film 52 is formed by a shallow trench isolation (STI) method for improving the degree of integration.

Then, after forming the N-well A with a predetermined depth in the active region of the semiconductor substrate 50, the P-well B is formed by the same method as that for the N-well A. Here, the P-well 56 may be formed prior to the N-well A.

Figure 3B:
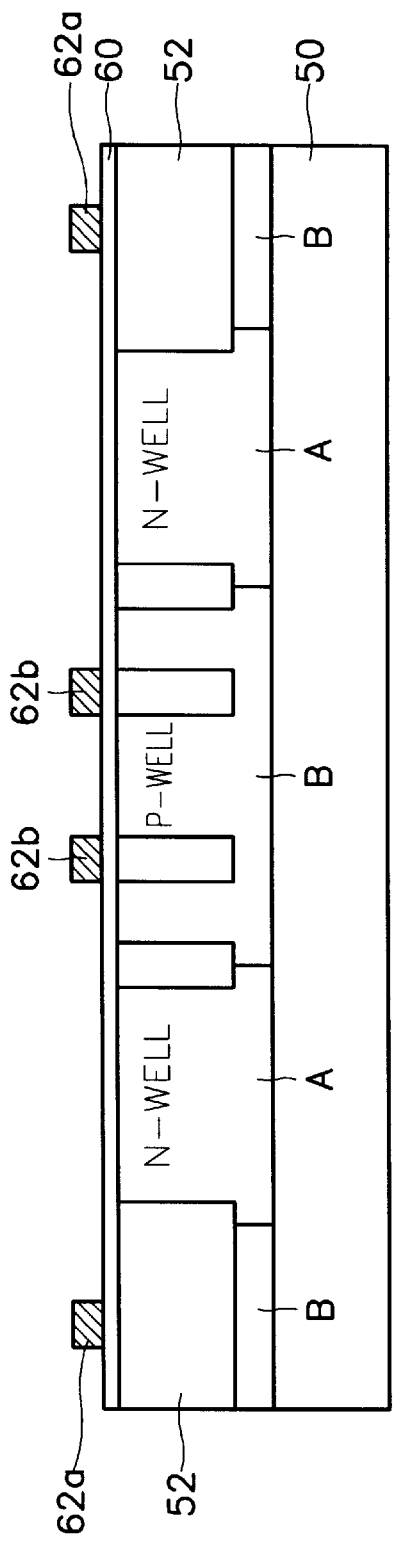
Figure 4B:
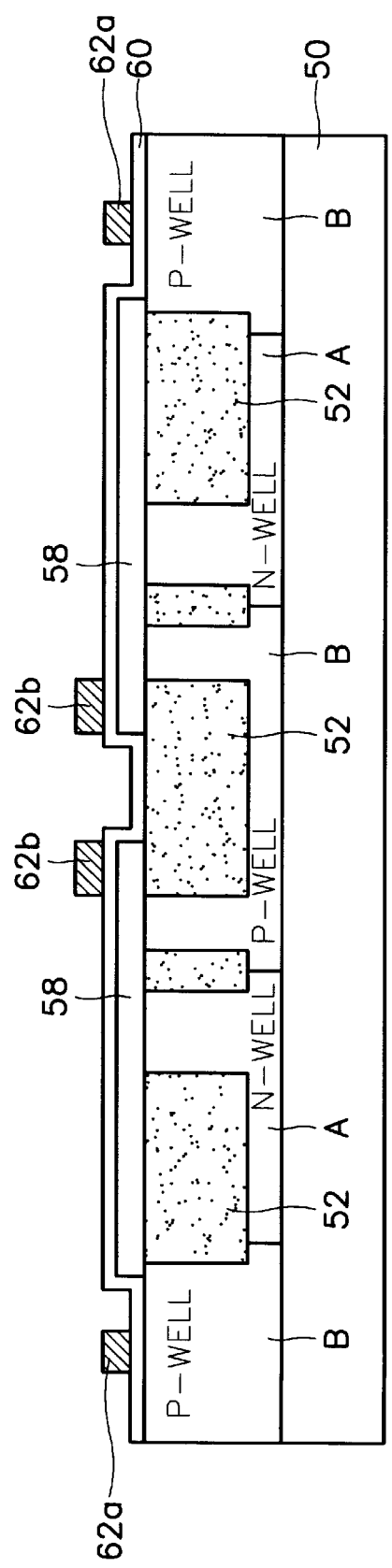

FIGS. 3B and 4B illustrate the step of forming gates electrode 58, 62a and 62b.

In detail, a thin oxide layer is grown on the semiconductor substrate 50 having the isolation film 52, the N-well A and the P-well B, thereby forming a gate insulation film (not shown). After depositing a doped polysilicon on the gate insulation film, the polysilicon layer is patterned using the mask patterns 120 and 122 for forming the gates of the driver transistors and the PMOS load transistors of FIG. 2B, to thereby form the first gate electrode 58. As a result, the first gate electrode 58 is used as the common gate of the second driver transistor and the second PMOS load transistor. At this time, the common gate of the first driver transistor and the first PMOS load transistor is simultaneously formed.

Next, a thin insulation film 60 is formed on the entire surface of the resultant structure having the first gate electrode 58. Then, a doped polysilicon layer is formed on the insulation film 60. The polysilicon layer is patterned using the mask patterns 130 and 132 for forming the gates of the access transistors of FIG. 4B to form second and third gate electrodes 62a and 62b. The second gate electrode 62a of FIGS. 3B and 4B are used as the gate electrode of the first access transistor, and the third gate electrode 62b is used as the gate electrode of the second access transistor. Also, the insulation film 60 is used as the gate insulation film of the second and third gate electrodes 62a and 62b, and simultaneously isolates the first gate electrode 58 from the second and third gate electrodes 62a and 62b.

FIGS. 3C and 4C illustrate the step of forming sources/drains of each transistor, the N-well pick-up region and the P-well pick-up region.

In detail, a photolithography process is performed using the mask patterns 140 and 142 of FIG. 2C to define the N+-impurity region. A high concentration of N+-impurity ions are implanted to form first, second and third N+-impurity regions 64a, 64b and 64c. Next, a photolithography process is performed using the reverse mask patterns of the mast patterns 140 and 142. Then, a high concentration of P+-impurity ions are implanted to form first and second P+-impurity regions 66a and 66b.

The first N+-impurity region 64a of FIGS. 3C and 4C is used as the sources/drains of the first access transistor and the first driver transistor. The second N+-impurity region 64b is used as the sources/drains of the second access transistor and the second driver transistor. The third N+-impurity region 64c is used as the N-well pick-up region for applying a bias voltage to the N-well.

Also, the first P+-impurity region 66a is used as the sources/drains of the first and second PMOS load transistors, and the second P+-impurity region 66b is used as the P-well pick-up region for applying a bias voltage to the P-well 56.

FIGS. 3D and 4D illustrate the step of forming a first plug 70.

In detail, an insulation material is thickly deposited on the resultant structure of FIGS. 3C and 4C and then planarized to form a first interlayer dielectric (ILD) film 68. Then, the first ILD film 68 is partially etched using the mask patterns 150, 152, 154 and 156 for forming the node contact of FIG. 4D, thereby forming a contact hole which simultaneously exposes a part of the first gate electrode 58 and a part of the first N+-impurity region 64a. Then, a metal for wiring is deposited on the resultant structure having the contact hole and then etched back to form the first plug 70 filling the contact hole.

The first plug 70 shown in FIG. 6D connects the drain (or source) of the first driver transistor to the first gate electrode 58 of the second PMOS load transistor.

Figure 3E:
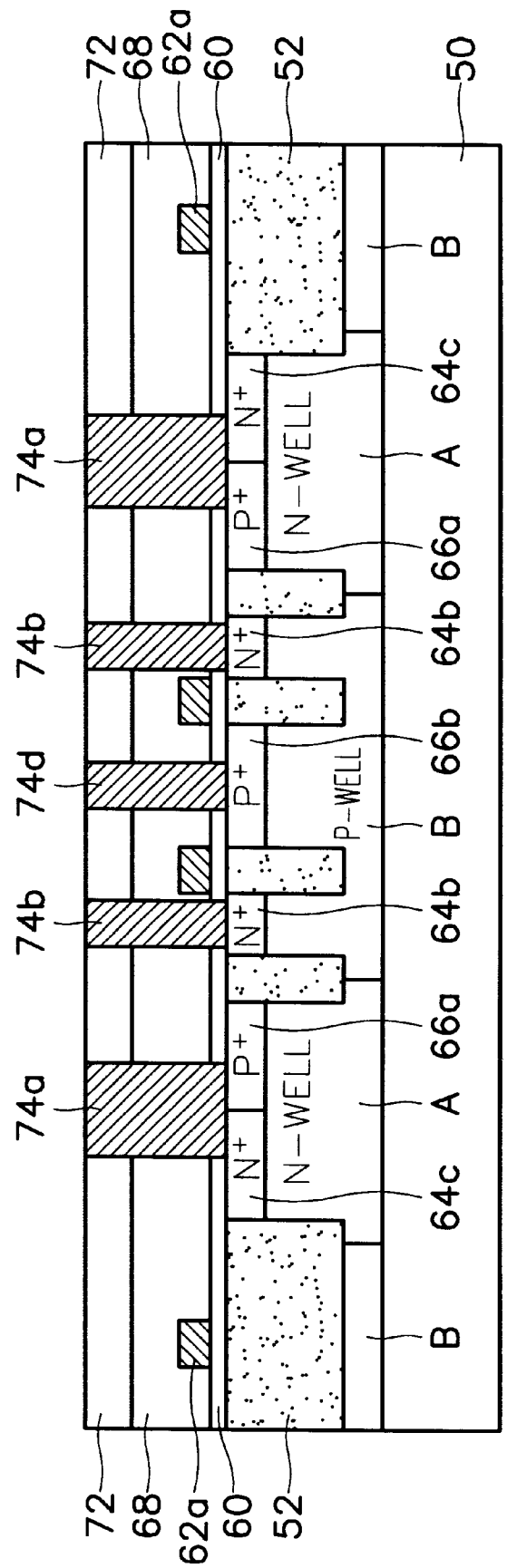
Figure 4E:
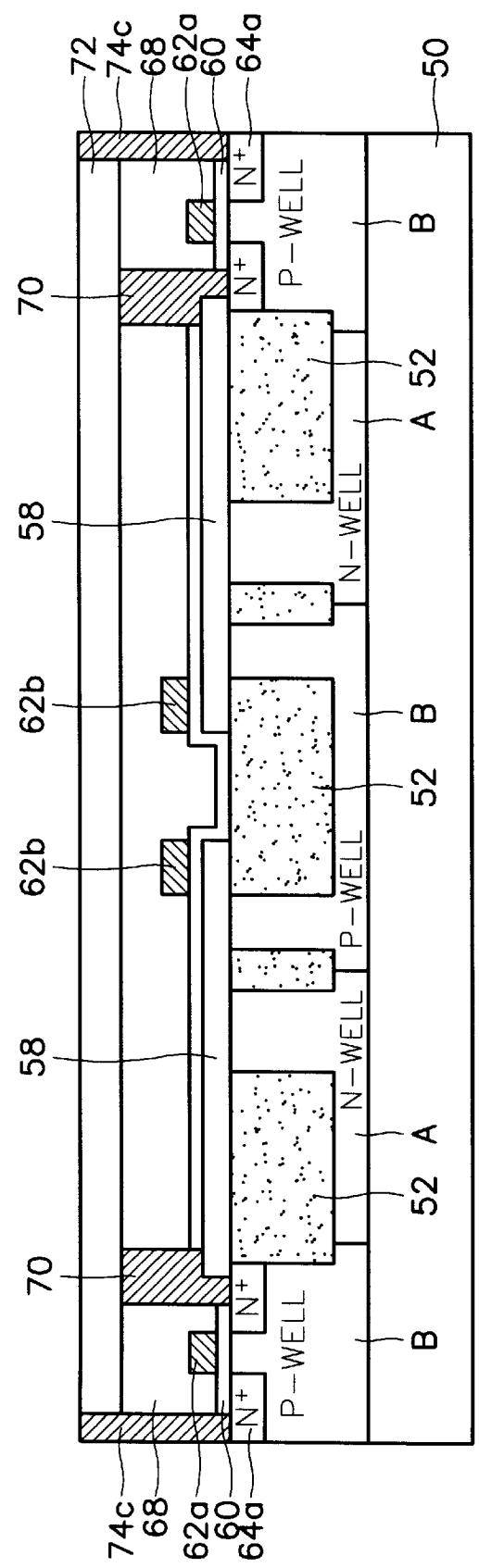

FIGS. 3E and 4E illustrate the step of forming second plugs 74a, 74b, 74c and 74d.

In detail, an insulation material is deposited on the resultant structure having the first plug 70 and then planarized to form a second ILD film 72. Then, the second ILD film 72 is partially etched using the mask patterns 161~166 and 168 for forming the metal contact of FIG. 2E, thereby forming a contact hole which exposes the N+-impurity regions 64a, 64b and 64c and the P+-impurity regions 66a and 66b. Then, a metal is deposited on the resultant structure having the contact hole and then etched back to form the second plugs 74a, 74b, 74c and 74d filling the contact hole.

The second plug 74a connects the source 66a of the second PMOS load transistor and the N-well pick-up region 64c to a Vcc line to be formed by a subsequent step. The second plug 74b connects the source 64b of the second driver transistor to the Vss line. The second plug 74c connects the drain 64a of the first access transistor to a pad, and the second plug 74d connects the P-well pick-up region 66b to the Vss line.

Figure 3F:
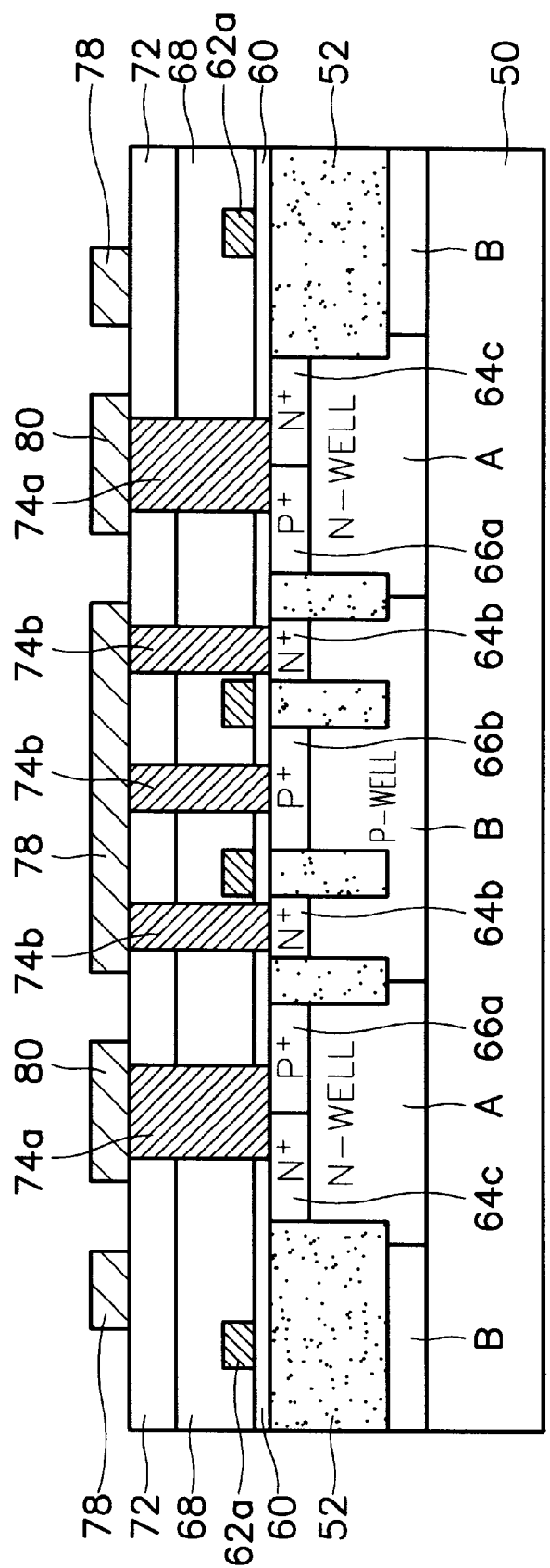

FIGS. 3F and 4F represent the step of forming a pad 76, a ground line 78 and a power line 80.

In detail, a metal layer, e.g., an aluminum (Al) layer, is formed on the resultant structure having the second plugs 74a, 74b and 74c. Then, the metal layer is patterned using the mask pattern 170 for forming the power line, the mask patterns 172 and 174 for forming the ground line and the mask patterns 176 and 178 for forming the pads, shown in FIG. 2F, thereby forming the pad 76, the ground line 78 and the power line 80.

The pad 76 connects the drain 62a of the first access transistor to the bit line.

The ground line 78 is connected to the source (not shown) of the first driver transistor and the source 64b of the second driver transistor via the second plug 74b.

The power line 80 is connected to the source/drain (not shown) of the first PMOS load transistor, the source/drain 66a of the second PMOS load transistor, and the N-well pick-up region 64c via the second plug 74a.

Also, referring to FIGS. 3F and 4F, the source 66a of the PMOS load transistor and N-well pick-up region 64c are formed by being adjacent to each other, and simultaneously connected to the power line 80 via one contact hole. Also, the ground line 78 is simultaneously connected to the source 64b of the driver transistor and the P-well pick-up region 66b.

Also, the ground line 78 and the power line 80 are formed in the same conductive layer.

Figure 3G:
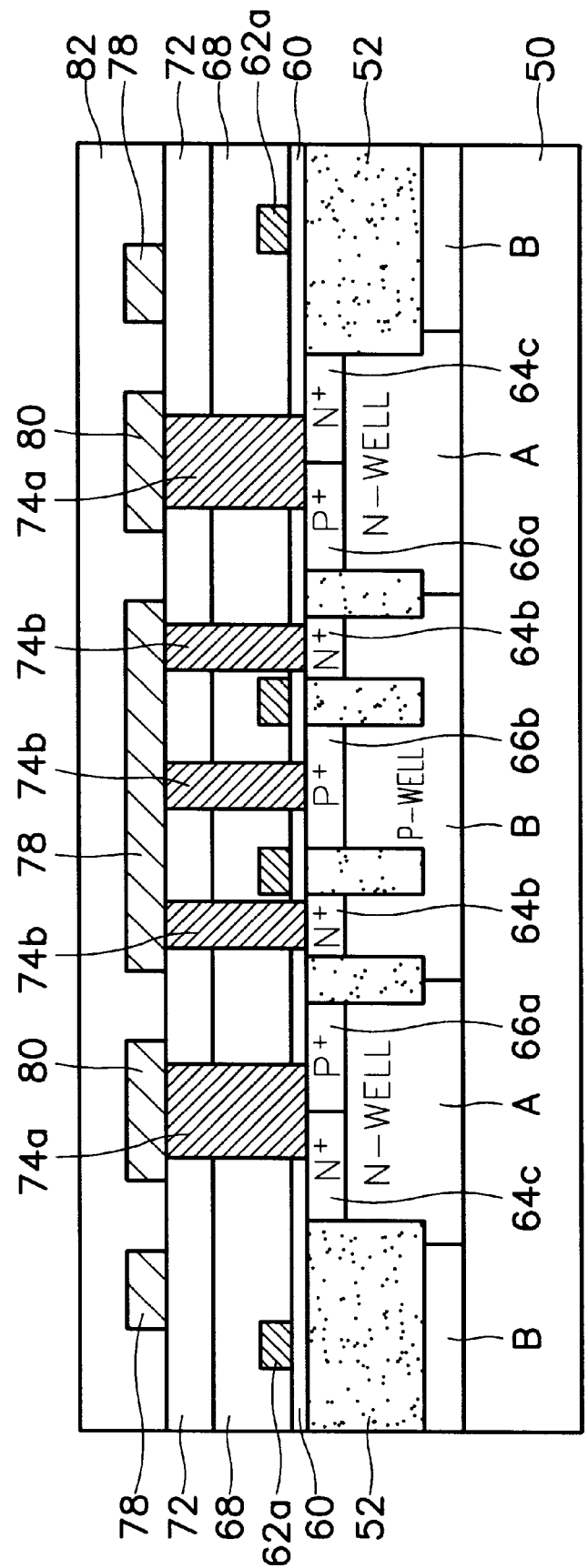
Figure 4G:
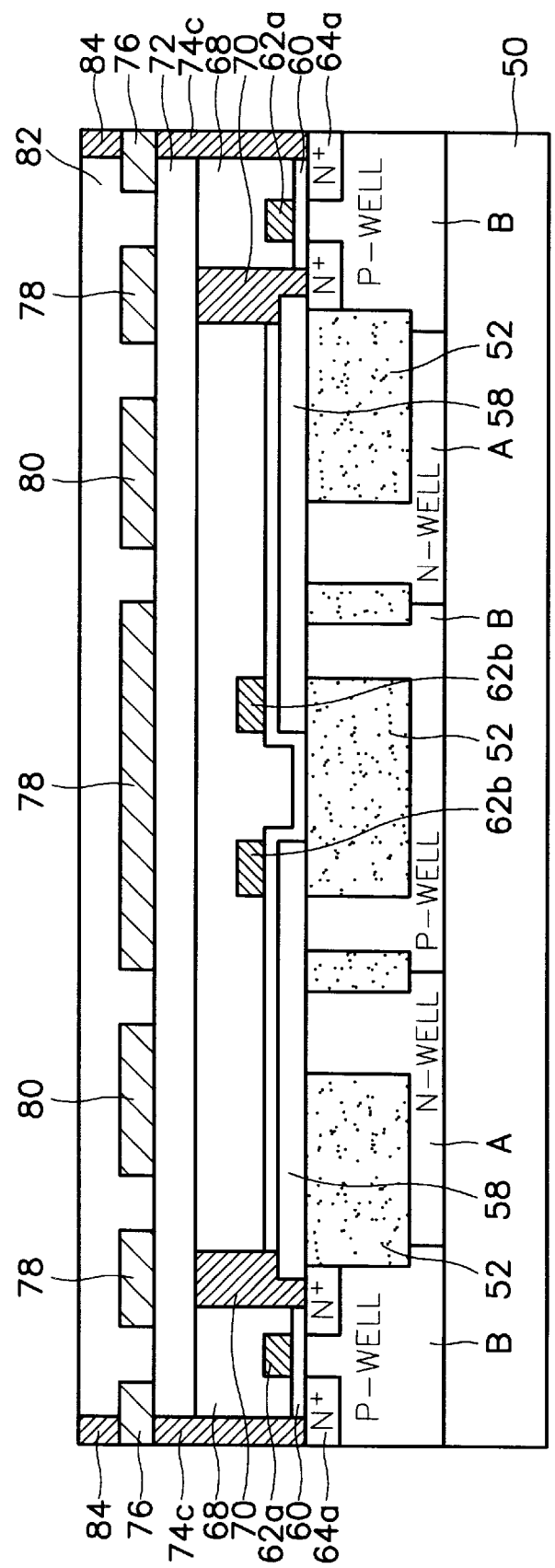

FIGS. 3G and 4G illustrate the step of forming a bit line contact.

In detail, an oxide layer is deposited on the resultant structure having the pad 76, the ground line 78 and the power line 80 to form a third ILD film 82. Then, the third ILD film 82 is partially etched using the mask patterns 180 and 182 for forming the bit line contact of FIG. 2G, thereby forming a contact hole which exposes the pad 76. Then, a metal, e.g., Al, is deposited on the resultant structure having the contact hole, and then etched back to form a third plug 84 which fills the contact hole while connected to the pad 76.

The third plug connects a bit line to be formed to the pad 76.

Figure 3H:
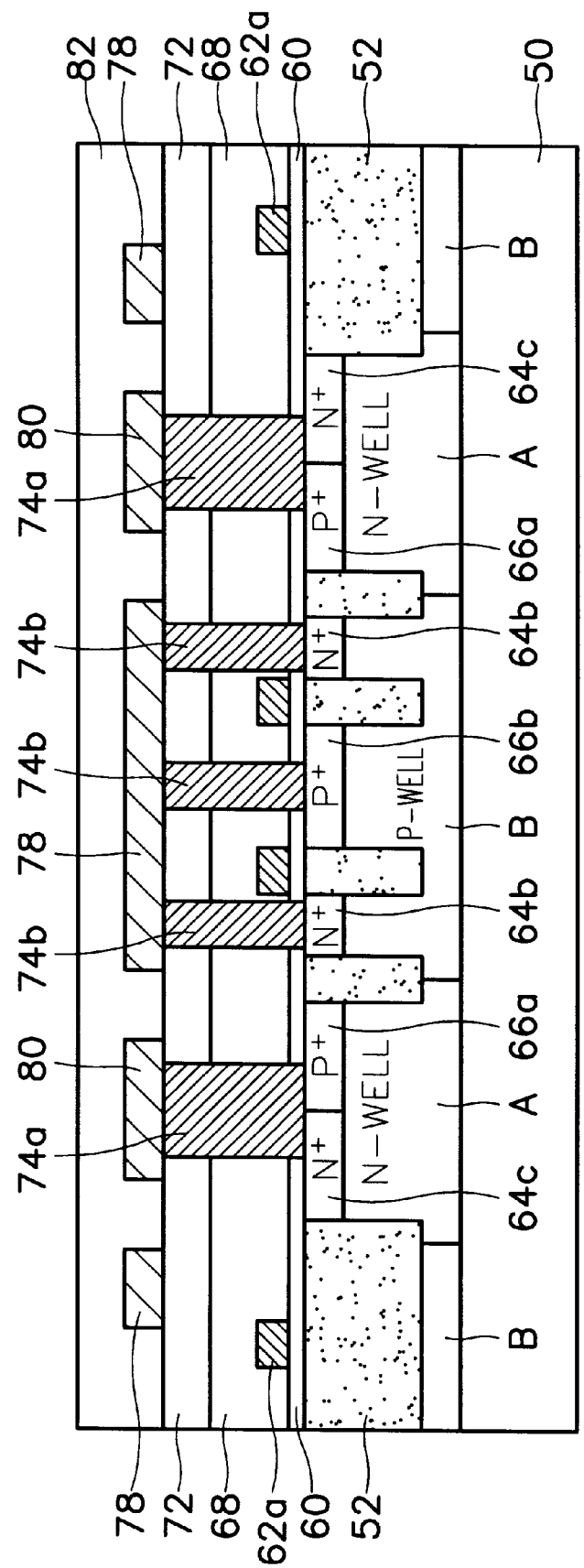
Figure 4H:
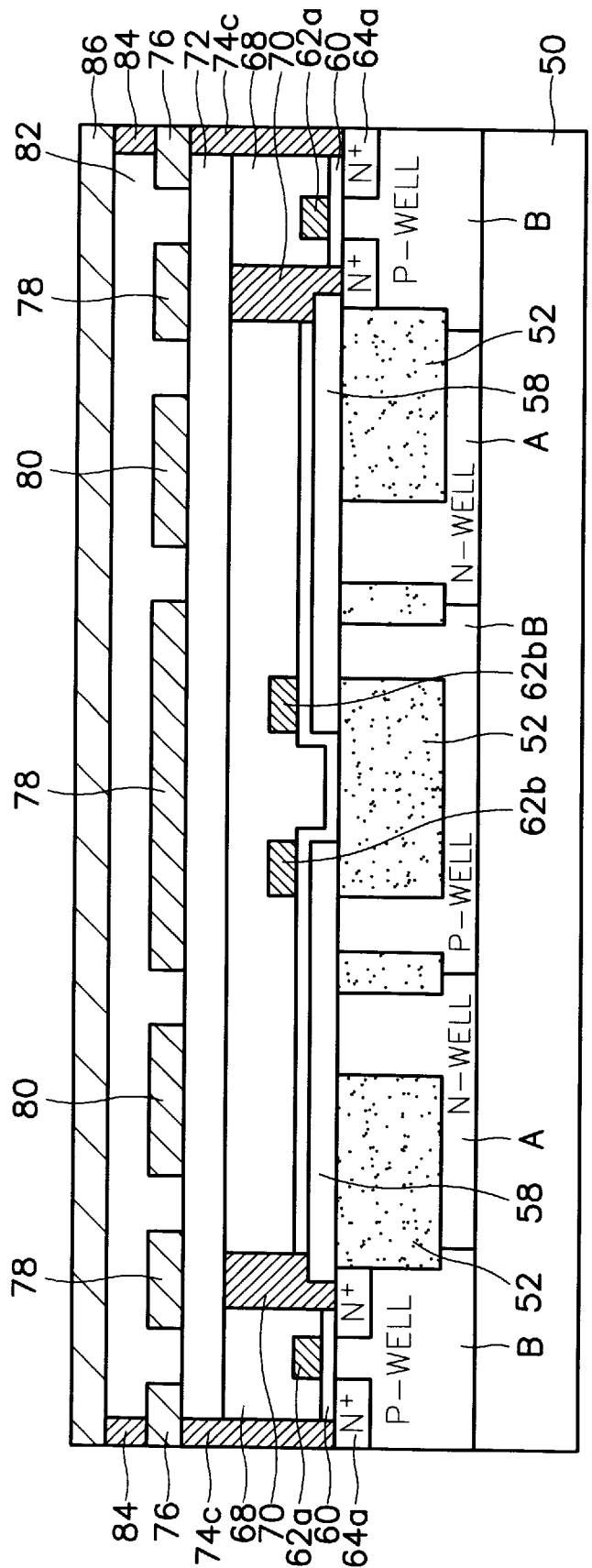

FIGS. 3H and 4H illustrate the step of forming first and second bit lines BL and $\overline{BL}$.

In detail, a metal layer, e.g., an Al layer, is formed on the resultant structure having the third plug 84, and then patterned through a photolithography process using the mask patterns 190 and 192 for the bit line of FIG. 2H to form a bit line 86. The bit line 86 is connected to the drain 64a of the first access transistor via the third plug 84, the pad 76 and the second plug 74c. Also, the bit line 86 may be formed by forming a contact hole exposing the pad 76 without forming the third plug 84, depositing a metal layer, e.g., an Al layer, and then patterning the metal layer using the mask patterns 190 and 192 of FIG. 2H.

Then, the SRAM of the present invention is completed by a subsequent process.

Figure 5:
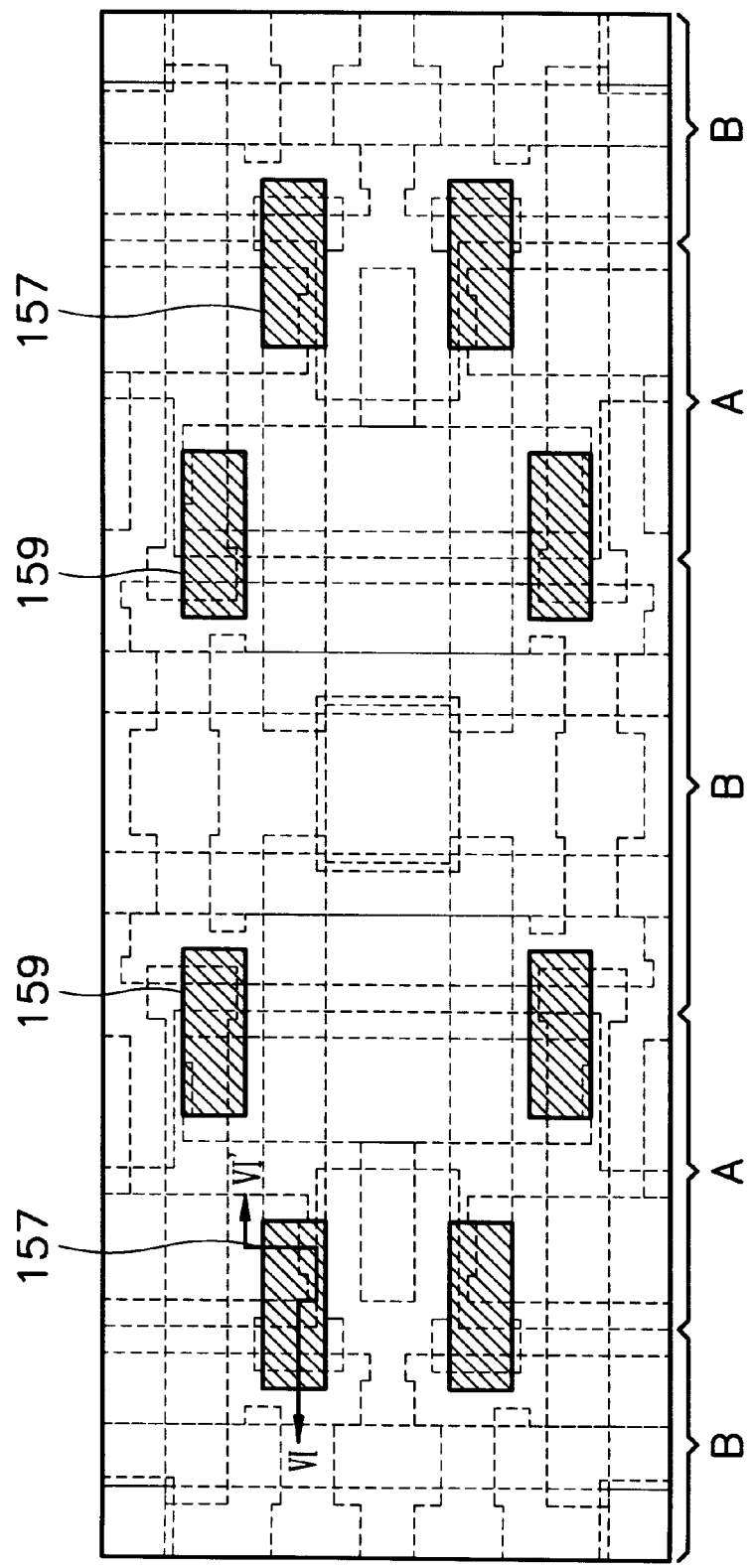
FIG. 5 is a layout diagram of an SRAM device according to another preferred embodiment of the present invention.

FIG. 5 is a layout diagram for manufacturing an SRAM device according to another embodiment of the present invention, showing the portion corresponding to the mask patterns of FIG. 2D.

Referring to FIG. 5, an output node of a first NMOS inverter including the first driver transistor and the first access transistor, a drain node of the first PMOS load transistor, and an input node of a second NMOS inverter including the second driver transistor and the second access transistor are connected via one contact hole 157.

Also, an output node of the second NMOS inverter including the second driver transistor and the second access transistor, a drain node of the second PMOS load transistor, and an input node of the first NMOS inverter including the first driver transistor and the first access transistor are connected via one contact hole 159.

According to a conventional SRAM device, when connecting an N-type active region as an output node of an NMOS inverter to a P-type active region as a drain node of a PMOS load element, each contact hole is connected to the nodes, and then the nodes are connected by a conductive layer connecting the contact holes. Thus, the number of contact holes increases by the number of the nodes, thereby complicating the structure of the cell. However, in the SRAM device of the present invention as shown in FIG. 5, three nodes can be connected simultaneously via one contact hole, so that the number of contact holes can be reduced, simplifying the structure of the memory cell.

Figure 6:
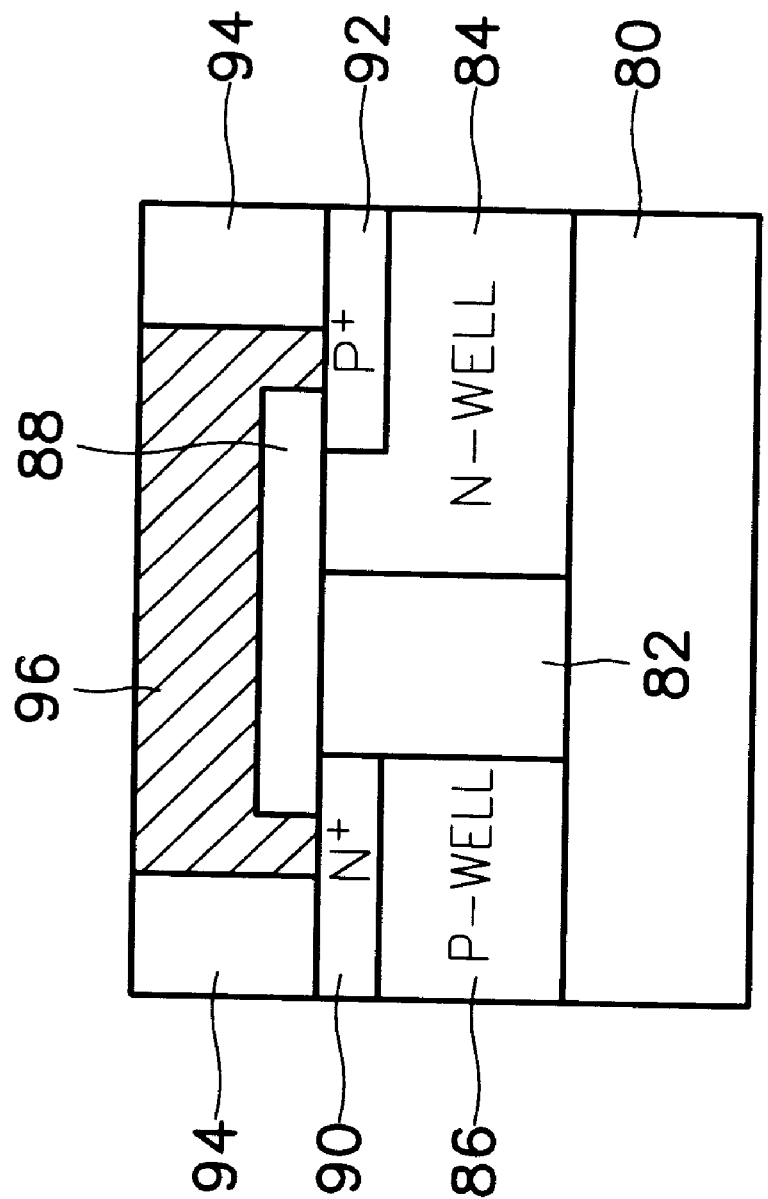
FIG. 6 is a sectional view of the SRAM device manufactured based on the layout of FIG. 5.

FIG. 6 is a sectional view of the SRAM device, cut along line VI–VI' of FIG. 5.

Here, reference numeral 80 represents a semiconductor substrate, reference numeral 82 represents an isolation film, reference numeral 84 represents an N-well, reference numeral 86 represents a P-well, reference numeral 88 represents a common gate electrode of the first driver transistor and the first PMOS load transistor, reference numeral 90 represents a common active region of the source of the first access transistor and the drain of the first driver transistor, reference numeral 92 represents the source (or drain) of the first PMOS load transistor, reference numeral 94 represents an ILD film, and reference numeral 96 represents a conductive plug.

In FIG. 6, the output node of the first NMOS inverter including the first driver transistor and the first access transistor, the drain node of the first PMOS load transistor, and the input node of the second NMOS inverter including the second driver transistor and the second access transistor are opened by one contact hole and connected by the conductive plug 96 filling the contact hole.

In the SRAM device according to the present invention, the active region for forming the NMOS transistor and the active region for forming the PMOS transistor are appropriately arranged to have an optimum size in the memory cell. Thus, the P-well pick-up region and the N-well pick-up region can be formed in the memory cell. Thus, it is unnecessary to secure extra impurity regions for applying a bias voltage to the P-well and N-well outside the memory cell, so that the chip size is remarkably reduced.

Also, the well bias voltage can be applied within each memory cell, so that the voltage drop by a resistor can be reduced, improving the voltage characteristic of the device compared to that of the conventional case.

In addition, the output node of one CMOS inverter and the input node of the other CMOS inverter are connected by one contact hole, so that the number of contact holes can be reduced, simplifying the structure of the memory cell.

Also, since the number of contact holes is reduced, there are fewer steps for forming contact holes, thereby simplifying the manufacturing process.

While the present invention has been illustrated and described with reference to specific embodiment, the present invention is not limited to the particular form illustrated, and further modifications and alterations will occur to those skilled in the art within the spirit and scope of this invention.

What is claimed is:

1. A static random access memory (SRAM) device having a memory cell array region in which a plurality of unit cells are arranged in a matrix such that cells adjacent in the Y-axial direction are symmetrical with respect to the X-axis, and cells adjacent in the X-axial direction are symmetrical with respect to the Y-axis, the unit cell comprising:

first and second P-wells and an N-well, all formed in a rectangular region such that the N-well is sandwiched between the first and second P-wells;

first and second P-well pick-up regions, the first P-well pick-up region being formed in the first P-well, and the second P-well pick-up region being formed in the second P-well, the first and second P-well pick-up regions being arranged at opposite corners of the rectangular region;

a first active region formed in the first P-well at a predetermined distance from the first P-well pick-up region;

a second active region formed in the second P-well at the predetermined distance from the second P-well pick-up region, the second active region being substantially similar in shape to the first active region, but displaced in location from the first active region by a rotation of 180 degrees around the center of the rectangular region;

a third active region formed in the N-well between the first and second active regions, the third active region being in the shape of a bar pattern parallel to the Y-axial direction, wherein a lower end of the bar pattern of the third active region is elongated to a lower border of the N-well;

a fourth active region formed in the N-well between the first and second active regions, the fourth active region being in the shape of a bar pattern parallel to the Y-axial direction, wherein an upper end of the bar pattern of the fourth active region is elongated to an upper border of the N-well, the fourth active region being substantially similar in shape to the third active region, but displaced in location from the third active region by a rotation of 180 degrees around the center of the rectangular region;

a first N-well pick-up region formed in the N-well contacting a first side end of the third active region, and elongated to a first side border of the N-well;

a second N-well pick-up region formed in the N-well contacting a second side of the fourth active region, and elongated to a second side border of the N-well;

a first gate electrode arranged adjacent to the second active region, crossing the first active region and the third active region adjacent to the first active region;

a second gate electrode arranged adjacent to the first active region, crossing the second active region and the fourth active region adjacent to the second active region;

first and second word lines arranged parallel to the Y-axis, crossing the first and second active regions;

a first contact for electrically connecting the first and second gate electrode to the second and first active regions, respectively;

a second contact for electrically connecting the first and second gate electrodes to the third and fourth active regions, respectively;

first and second power contacts each for exposing the first N-well pick-up region and the third active region adjacent to the first N-well pick-up region, and the second N-well pick-up region and the fourth active region adjacent to the second N-well pick-up region, respectively;

a power line arranged in the Y-axial direction, covering the first and second power contacts;

a first ground contact for exposing the first active region located between the first N-well pick-up region and the P-well pick-up region;

a second ground contact for exposing the second active region located between the second N-well pick-up region and the P-well pick-up region;

a first ground line arranged in the Y-axial direction, covering the first ground contact;

a second ground line arranged in the Y-axial direction covering the second ground contact;

a first bit line contact for exposing the first active region located at the border of the first P-well region;

a first bit line arranged in the X-axial direction, covering the first bit line contact;

a second bit line contact for exposing the second active region located at the border of the second P-well region; and a second bit line arranged in the X-axial direction, covering the second bit line contact.

2. The SRAM device of claim 1, wherein the first power contact simultaneously exposes the first N-well pick-up region and the third active region.

3. The SRAM device of claim 1, wherein the second power contact simultaneously exposes the second N-well pick-up region and the fourth active region.

* * * * *